United States Patent
Webb et al.

(10) Patent No.: US 10,217,657 B2
(45) Date of Patent: Feb. 26, 2019

(54) ACTIVE SUBSTRATE ALIGNMENT SYSTEM AND METHOD

(71) Applicant: Varian Semiconductor Equipment Associates, Inc., Gloucester, MA (US)

(72) Inventors: Aaron P. Webb, Austin, TX (US); Timothy J. Miller, Ipswich, MA (US); Tammy Jo Pride, Pflugerville, TX (US); Christopher N. Grant, Dripping Springs, TX (US); James D. Strassner, Austin, TX (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/511,542

(22) PCT Filed: Sep. 4, 2015

(86) PCT No.: PCT/US2015/048463
§ 371 (c)(1),
(2) Date: Mar. 15, 2017

(87) PCT Pub. No.: WO2016/043987
PCT Pub. Date: Mar. 24, 2016

(65) Prior Publication Data
US 2017/0294330 A1    Oct. 12, 2017

Related U.S. Application Data

(60) Provisional application No. 62/050,363, filed on Sep. 15, 2014.

(51) Int. Cl.
*H01L 21/68* (2006.01)
*H01J 37/304* (2006.01)
(Continued)

(52) U.S. Cl.
CPC ............ *H01L 21/681* (2013.01); *C23C 14/48* (2013.01); *G06K 9/6202* (2013.01); *G06T 7/001* (2013.01);
(Continued)

(58) Field of Classification Search
CPC ....... H01L 21/681; H01J 37/045; H01J 37/20; H01J 37/22; H01J 37/3045; H01J 37/3171;
(Continued)

(56) References Cited

U.S. PATENT DOCUMENTS

2007/0073443 A1   3/2007   Kurita et al.
2008/0128621 A1   6/2008   Berry
(Continued)

FOREIGN PATENT DOCUMENTS

CN   102244026 A   11/2011
JP   06281416 A   7/1994
(Continued)

*Primary Examiner* — McDieunel Marc

(57) ABSTRACT

An active substrate alignment system for an ion implanter, the system including a platen, a registration device adapted to selectively move a substrate engagement surface disposed adjacent the platen for limiting movement of a substrate disposed on the platen, a camera configured to capture an image of the substrate before the substrate is disposed on the platen, and a controller in communication with the camera and the registration device, the controller configured to command the registration device to move the substrate engagement surface based on the image to limit movement of the substrate in a predetermined manner.

8 Claims, 5 Drawing Sheets

(51) Int. Cl.
*H01J 37/317* (2006.01)
*G06T 7/73* (2017.01)
*C23C 14/48* (2006.01)
*G06K 9/62* (2006.01)
*G06T 7/00* (2017.01)
*H01J 37/20* (2006.01)
*H01J 37/22* (2006.01)

(52) U.S. Cl.
CPC ................ *G06T 7/74* (2017.01); *H01J 37/20* (2013.01); *H01J 37/22* (2013.01); *H01J 37/3045* (2013.01); *H01J 37/3171* (2013.01); *G06T 2207/30148* (2013.01)

(58) Field of Classification Search
CPC . G06T 7/74; G06T 2207/30148; C23C 14/48; G06K 9/6202
See application file for complete search history.

(56) References Cited

U.S. PATENT DOCUMENTS

| | | |
|---|---|---|
| 2011/0248190 A1 | 10/2011 | Tanaka et al. |
| 2013/0288400 A1 | 10/2013 | Graff et al. |

FOREIGN PATENT DOCUMENTS

| | | |
|---|---|---|
| JP | 06281416 A | 10/1994 |
| JP | 2011181849 A | 9/2011 |

ACTIVE SUBSTRATE ALIGNMENT SYSTEM AND METHOD

CROSS-REFERENCE

This application claims priority to U.S. Provisional Patent Application No. 62/050,363, filed Sep. 15, 2014, the entirety of which application is herein incorporated by reference.

FIELD OF THE DISCLOSURE

Embodiments of the present disclosure relate to the field of semiconductor and solar cell processing, and more particularly to an active substrate alignment system and corresponding method for an ion implanter.

BACKGROUND OF THE DISCLOSURE

Ion implantation is a technique for introducing conductivity-altering impurities into semiconductor and solar cell substrates. During ion implantation, a desired impurity material is ionized in an ion source chamber, the ions are accelerated to form an ion beam of prescribed energy, and the ion beam is focused and directed toward the surface of a substrate positioned in a process chamber. The energetic ions in the ion beam penetrate into the bulk of the substrate material and are embedded into the crystalline lattice of the material to form a region of desired conductivity.

Two concerns of the solar cell manufacturing industry are manufacturing throughput and solar cell efficiency. Solar cell efficiency is a measure of the amount of solar energy a solar cell is able to convert into electricity, and is closely tied to manufacturing precision. As technologies advance, higher solar cell efficiencies are required to stay competitive in the solar cell manufacturing industry. Improving precision while maintaining or improving manufacturing throughput is therefore highly desirable.

Ion implantation has been demonstrated as a viable method to dope solar cells in a precise manner. Use of ion implantation obviates processes necessary for existing technologies, such as furnace diffusion. For example, a laser edge isolation process may be removed if ion implantation is used instead of furnace diffusion because ion implantation will not dope areas other than a desired surface. Besides removal of processes, higher efficiencies have been demonstrated using ion implantation. Ion implantation also offers the ability to perform a blanket implant of an entire surface of a solar cell or a selective (or patterned) implant of part of the solar cell. Selective implantation at high throughputs using ion implantation avoids the costly and time-consuming lithography or patterning processes used for furnace diffusion. Selective implantation also enables new solar cell designs.

Micron-level precision may be necessary for the implantation of certain types of solar cells to achieve necessary geometries and tolerances. For example, selective emitter (SE) and interdigitated backside contact (IBC) solar cells have doped regions a few μm apart. If a mask is used to create such doped regions in a cell during ion implantation the locations of the regions are dictated by the placement of the mask relative to the cell. In some cases, the successive introduction of two or more impurity materials into regions of a cell may be desired. This may be achieved by implanting a cell with a first dopant using a first mask at a first ion implantation station, and subsequently implanting the cell with a second dopant using a second mask at a second ion implantation station. In order to implant the first dopant and the second dopant into particular regions of the cell, the first and second masks have to have complementary patterns and have to be aligned with the cell in a nearly identical manner. In other cases, precisely centering a masked dopant pattern on a cell may be desired. As will be appreciated, if precise mask alignment is not achieved in either of the above-described cases (i.e., successive alignment of multiple mask patterns or centering of one mask pattern), cells may not function as desired and/or subsequent processes employed in the manufacture of cells may not be properly aligned.

Any improvements to the precision, reliability, and speed of solar cell manufacturing would be beneficial to solar cell manufacturers worldwide and may accelerate the adoption of solar cells as an alternative energy source.

SUMMARY

This Summary is provided to introduce a selection of concepts in a simplified form as further described below in the Detailed Description. This Summary is not intended to identify key features or essential features of the claimed subject matter, nor is this summary intended to be an aid in determining the scope of the claimed subject matter.

An exemplary embodiment of an active substrate alignment system for an ion implanter in accordance with the present disclosure may include a platen, a registration device adapted to selectively move a substrate engagement surface disposed adjacent the platen for limiting movement of a substrate disposed on the platen, a camera configured to capture an image of the substrate before the substrate is disposed on the platen, and a controller in communication with the camera and the registration device, the controller configured to command the registration device to move the substrate engagement surface based on the image to limit movement of the substrate in a predetermined manner.

Another exemplary embodiment of an active substrate alignment system for an ion implanter in accordance with the present disclosure may include a platen, first and second registration devices adapted to selectively move respective first and second substrate engagement surfaces disposed on a first side of the platen for limiting movement of a substrate disposed on the platen, a camera configured to capture an image of the substrate before the substrate is disposed on the platen, and a controller in communication with the camera and the first and second registration devices, the controller configured to command the first and second registration devices to move the first and second substrate engagement surfaces based on the image to limit movement of the substrate in a predetermined manner, and first and second pushers disposed on a second side of the platen in a parallel relationship with one another and adapted to push the substrate into engagement with the first and second substrate engagement surfaces.

An exemplary embodiment of a method for aligning a substrate in accordance with the present disclosure may include capturing a live image of the substrate, based on the live image of the substrate, moving a substrate engagement surface disposed adjacent a platen so the substrate will assume a predetermined orientation after being positioned on the platen, disposing the substrate on the platen, and moving the substrate into engagement with the substrate engagement surface.

BRIEF DESCRIPTION OF THE DRAWINGS

By way of example, various embodiments of the disclosed device will now be described, with reference to the accompanying drawings, wherein.

DETAILED DESCRIPTION

Figure 1:
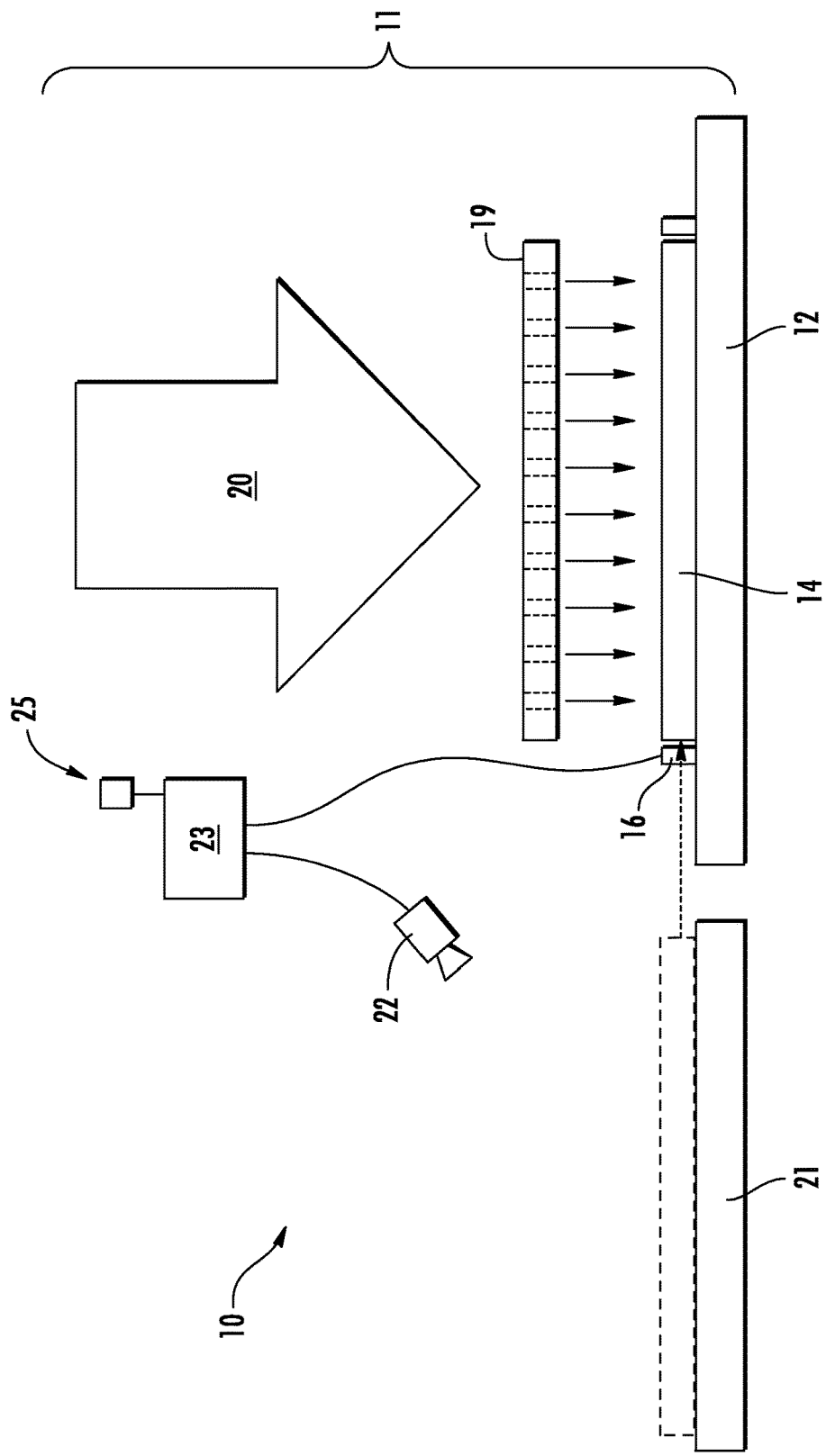
FIG. 1 is a side view of an exemplary embodiment of a substrate alignment system in accordance with the present disclosure.

An active substrate alignment system and method in accordance with the present disclosure will now be described more fully hereinafter with reference to the accompanying drawings, wherein preferred embodiments of the system and method are shown. The system and method may be embodied in many different forms and are not to be construed as being limited to the embodiments set forth herein. These embodiments are provided so this disclosure will be thorough and complete, and will fully convey the scope of the system and method to those skilled in the art. In the drawings, like numbers refer to like elements throughout.

The active substrate alignment system and method of the present disclosure are described herein in connection with an ion implanter and an associated ion implantation process. In other embodiments, the active substrate alignment system and method can be similarly implemented in a variety of other systems and processes, such as may be involved in the manufacture of solar cells or semiconductors, for example. Additionally, while the exemplary system and method disclosed herein are described in connection with the implantation of solar cells, such disclosure is provided for illustrative purposes, and the system and method can be similarly implemented for the implantation of other types of cells, including semiconductor wafers, light emitting diodes (LEDs), silicon-on-insulator (SOI) wafers, and other such components.

Figure 2:
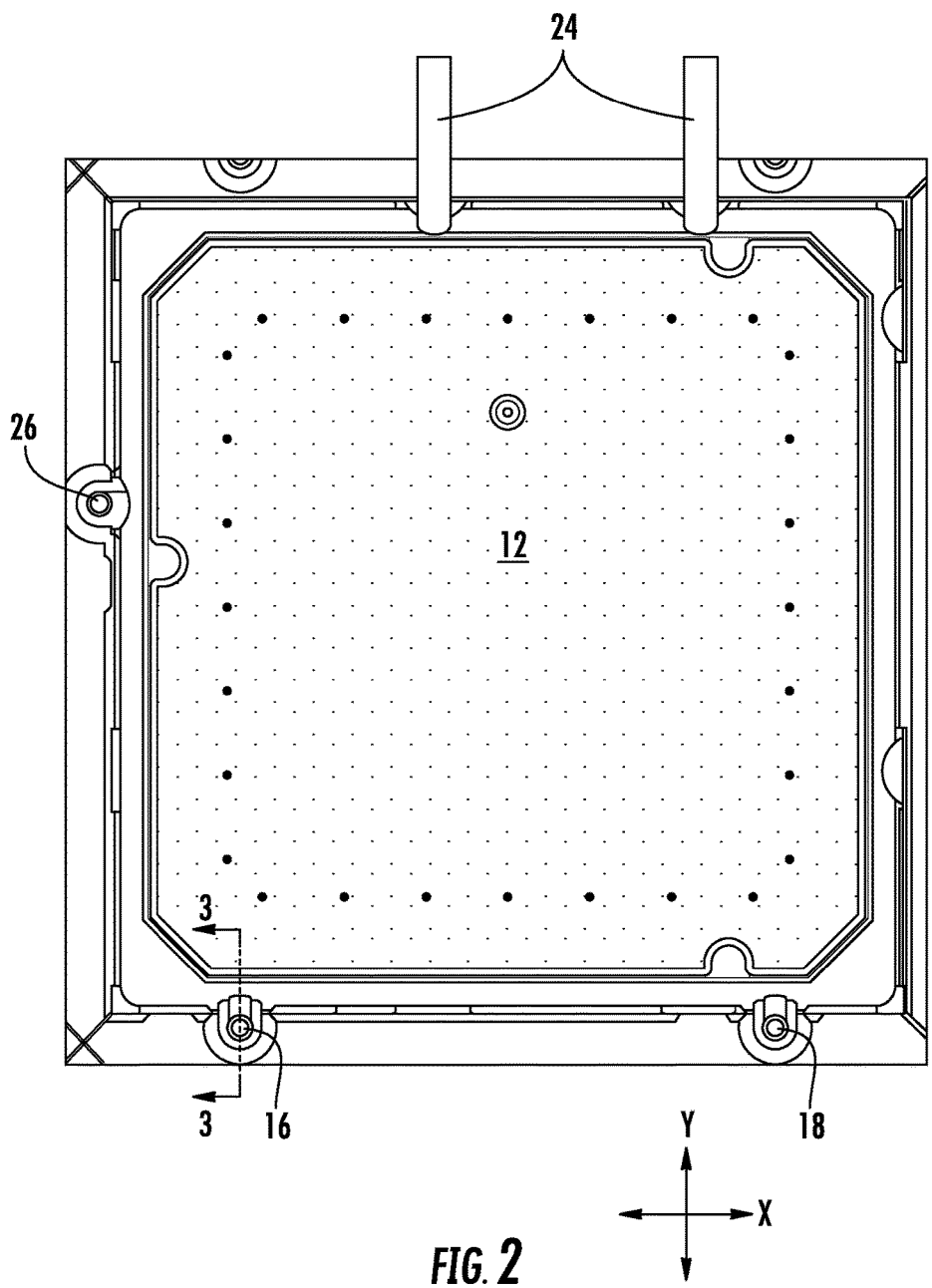
FIG. 2 is a plan view illustrating a platen of the exemplary substrate alignment system shown in FIG. 1.

FIG. 1 illustrates a schematic side view of an exemplary embodiment of a substrate alignment system (hereinafter "the system 10") in accordance with the present disclosure. The system 10 may generally include an ion implanter 11 having a platen 12 for holding a substrate 14 to be implanted. The ion implanter may include dynamic substrate registration devices 16, 18 (the registration device 18 is shown in FIG. 2) described in greater detail below. The ion implanter 11 may further include a mask 19 for creating a desired implantation pattern on the substrate 14 when an ion beam 20 is projected through the mask 19 and onto the substrate 14. The system 10 may further include a transport mechanism 21 (e.g., a conveyor belt, a robotic arm, etc.) adapted to convey the substrate 14 to the platen 12. The system 10 may further include a camera 22 adapted to capture images of substrates positioned on the transport mechanism 21 or on the platen 12, including images of existing implant patterns on such substrates. The camera 22 may be operatively connected to a controller 23. The controller may in-turn be operatively connected to the registration devices 16, 18 as further described below.

Referring to the plan view of the platen 12 shown in FIG. 2 (the substrate 14 is not shown on the platen 12 in FIG. 2 for clarity), the registration devices 16, 18 may be spaced apart from one another adjacent a first side of the platen 12 and may be used to controllably limit movement of the substrate 14 (FIG. 1) along the y-axis as further described below. The system 10 may further include one or more pushers 24 located adjacent a second side of the platen 12 opposite the registration devices 16, 18. The pushers 24 may be operatively connected to one or more drive mechanisms (not shown) adapted to selectively drive the pushers 24 horizontally back and forth in the direction of the arrows shown in FIG. 2. When the substrate 14 (FIG. 1) is placed atop the platen 12, the pushers 24 may be used to push the substrate 14 into engagement with the registration devices 16, 18 as further described below. The system 10 may further include a third registration device 26 adjacent a third side of the platen 12 for controllably limiting movement of substrate along the x-axis as further described below. Alternatively, registration device 26 may be replaced by an immobile wall, post, stop, or other static structure for limiting the movement of a substrate 14 (FIG. 1) along the x-axis.

Figure 3:
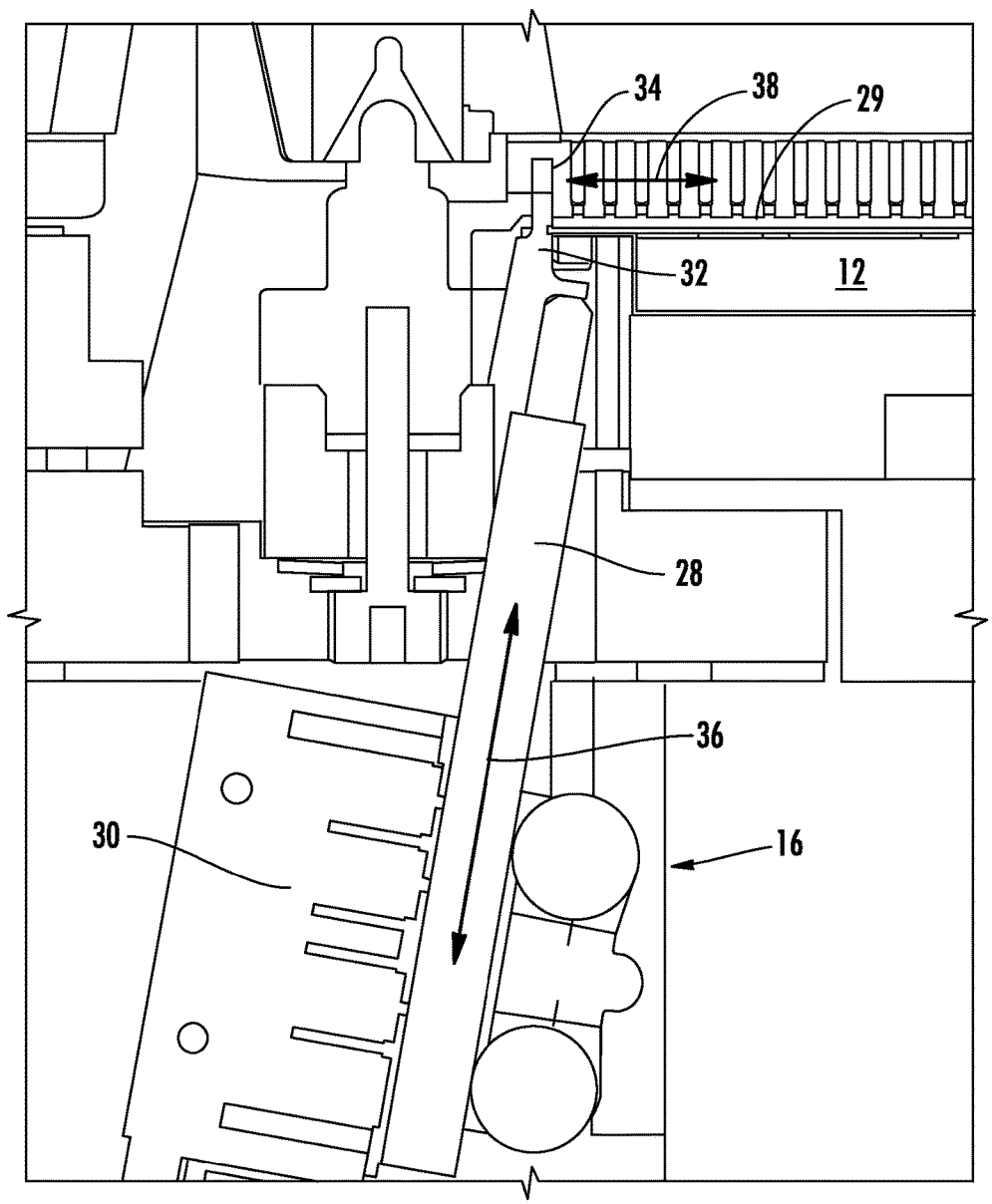
FIG. 3 is a cross-sectional side view taken along line 3-3 in FIG. 2 illustrating a substrate registration device of the exemplary substrate alignment system shown in FIG. 1.

Referring to FIG. 3, a cut-away view illustrating the registration device 16 and adjacent portions of the platen 12 and mask 19 taken along line 3-3 of FIG. 2 is shown. The registration device 16 may be identical to the registration devices 18, 26, and thus the following description of the registration device 16 can also apply to the registration devices 18, 26.

The registration device 16 may include an elongated shaft 28 coupled to a drive mechanism 30 located below the platen 12. The shaft 28 may be oriented at an oblique angle relative to the y-axis. The shaft 28 may terminate at its uppermost end in a finger 32 extending above a substrate supporting surface 29 of the platen 12 and having a substrate engagement surface 34 oriented perpendicular to the substrate supporting surface 29. The drive mechanism 30 may be adapted to extend and retract the shaft 28 along its longitudinal axis, as indicated by the arrow 36 shown in FIG. 3. Since the shaft 28 is oriented at an oblique angle relative to the y-axis as described above, extension and retraction of the shaft 28 may result in corresponding horizontal movement (i.e., movement along the x-axis) of the substrate engagement surface 34 of the finger 32 as indicated by the arrow 38 shown in FIG. 3. Movement of the shaft 28 along its longitudinal axis will also result in movement of the finger 32 vertically (i.e., along the y-axis), and thus the substrate engagement surface 34 may be sized to engage the substrate 14 along an appropriate portion of the substrate engagement surface 34.

In the illustrated embodiment, retraction of the shaft 28 may result in leftward horizontal movement of the substrate engagement surface 34, while extension of the shaft 28 may result in rightward horizontal movement of the substrate engagement surface 34. Thus arranged, the drive mechanism 30 may be employed to selectively and finely (e.g., with a precision of 5 µm) adjust the horizontal position of the substrate engagement surface 34 of the finger 32. The substrate engagement surface 34 may thus act as a selectively movable boundary for limiting horizontal movement of a substrate 14 supported by the platen 12.

Figure 4:
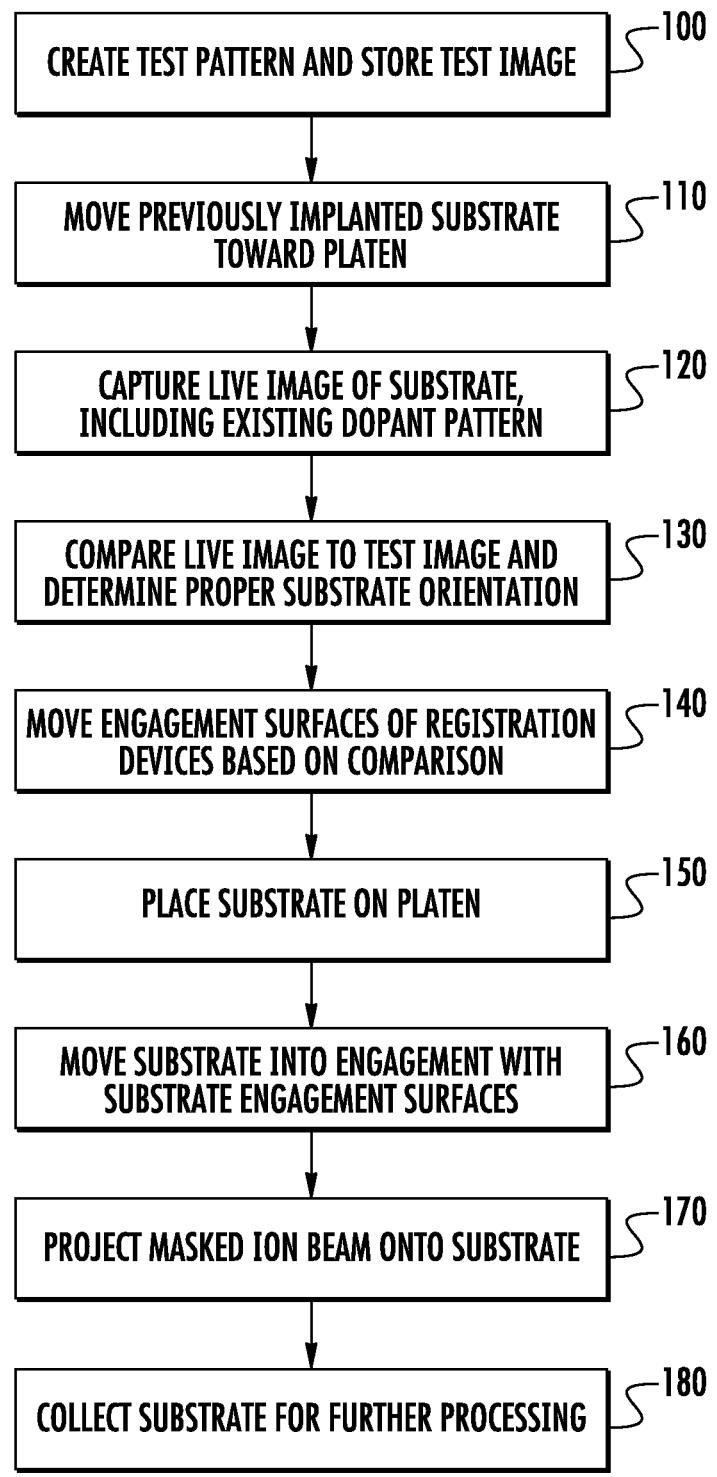
FIG. 4 is a flow diagram illustrating an exemplary method for using the exemplary substrate alignment system of FIG. 1 to identically align successive implantation patterns on a substrate.

Referring to FIG. 4, a flow diagram illustrating an exemplary method for using the above-described system 10 to identically align successive implantation patterns on a substrate is shown. The method may be used to successively implant two or more different impurity materials (e.g., boron and phosphorus) into desired regions of a substrate. The method will be described in conjunction with the schematic representations of the system 10 shown in FIGS. 1-3.

At block 100, a test pattern may be created on a test substrate (not shown) using the mask 19 of the ion implanter 11 in order to determine an exact orientation of a dopant pattern projected by the mask 19. This may be accomplished by positioning the test substrate on the platen 12 and projecting an ion beam through the mask 19 onto the test substrate. The camera 22 may capture an image of the test substrate, including the dopant pattern created on the test substrate, and the image may be stored in a memory 25 associated with the controller 23, for example. The image, hereinafter referred to as "the test image," may subsequently be used as a point of reference for adjusting the positions of the registration devices 16, 18 (and optionally the registration device 26, if provided) as further described below.

At block 110, a substrate, such as the substrate 14 shown in FIG. 1, having been previously implanted with a first impurity material in a masked pattern, may be conveyed toward the platen 12 by the transport mechanism 21.

While the substrate 14 is still on the transport mechanism 21, the camera 22 may, at block 120, capture an image of the substrate 14, including the edges of the substrate and the existing dopant pattern on the substrate 14. The image, hereinafter referred to as "the live image," may thus indicate the precise orientation of the exiting dopant pattern relative to the orientation of the substrate 14.

At a block 130, the controller 23 may use data representative of the live image captured in block 120 along with data representative of the test image captured in block 100 above to determine how the substrate 14 may be oriented on the platen 12 in order for the dopant pattern projected by the mask 19 to be precisely aligned with the existing dopant pattern on the substrate 14.

At block 140, the controller may, based on the determination made in block 130, manipulate the drive mechanisms 30 of the registration devices 16, 18, 26 to adjust the horizontal position of the substrate engagement surfaces 34 of the fingers 32 (as described above) in order for the existing dopant pattern on the substrate 14 to, after the substrate 14 is moved into engagement with the substrate engagement surfaces 34 as described below, be precisely aligned with the dopant pattern projected by the mask 19.

At block 150, the substrate 14 may be placed on the platen 12 by the transport mechanism 21 (or by another device) with the existing dopant pattern on the substrate 14. At block 160, the pushers 24 may move into engagement with one or more edges of the substrate 14 to move the substrate 14 horizontally toward the substrate engagement surfaces 34 of the fingers 32 of the registration devices 16, 18, 26. Although FIG. 2 shows pushers 24 configured to move the substrate 14 along the y-axis into engagement with registration devices 16, 18, one or more additional pushers can also be provided to move the substrate along the x-axis into engagement with registration device 26. With the substrate 14 engaging the substrate engagement surfaces 34 thusly, and with the substrate engagement surfaces 34 having been repositioned as described in block 140, the substrate 14 may be oriented to cause the existing dopant pattern on the substrate to be precisely aligned (e.g., to a precision of 40 um) with respect to the dopant pattern projected by the mask 19.

At block 170, the ion implanter 11 may project an ion beam containing ions of a second impurity material (a first impurity material having been previously implanted into the substrate 14 as described above) through the mask 19 and onto the substrate. With the substrate 14 having been oriented as described in block 160, the dopant pattern projected onto the substrate 14 by the mask 19 may align precisely with the existing dopant pattern on the substrate.

At block 180, the substrate 14 may be removed from the platen 12 and passed along for further processing.

Figure 5:
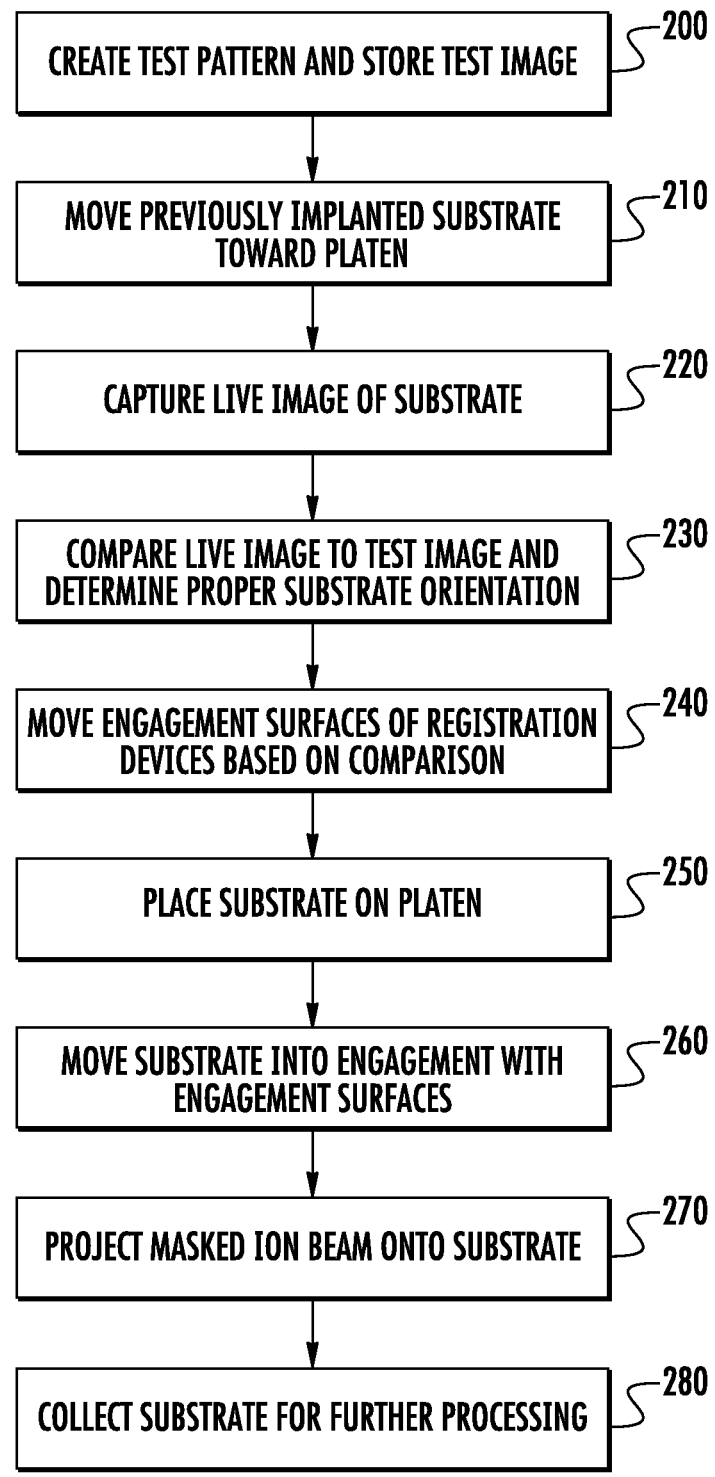
FIG. 5 is a flow diagram illustrating an exemplary method for using the exemplary substrate alignment system of FIG. 1 to orient a substrate in order to center a dopant pattern projected onto the substrate.

Referring to FIG. 5, a flow diagram illustrating an exemplary method for using the above-described system 10 to orient a substrate in order for a dopant pattern projected onto the substrate to be centered on the substrate (e.g., centered relative to the edges of the substrate) is shown. The method will be described in conjunction with the schematic representations of the system 10 shown in FIGS. 1-3.

At block 200, a test pattern may be created on a test substrate (not shown) using the mask 19 of the ion implanter 11 in order to determine the exact orientation of the dopant pattern projected by the mask 19. This may be accomplished by positioning the test substrate on the platen 12 and projecting an ion beam through the mask 19 onto the test substrate. The camera 22 may then capture an image of the test substrate, including the dopant pattern created on the test substrate, and data representative of the image may be stored in a memory 25 associated with the controller 23, for example. The image, hereinafter referred to as "the test image," may subsequently be used as a point of reference for adjusting the positions of the registration devices 16, 18 (and optionally the registration device 26, if provided) as further described below.

At block 210, a substrate, such as the substrate 14 shown in FIG. 1, may be conveyed toward the platen 12 by the transport mechanism 21.

While the substrate 14 is still on the transport mechanism 21, the camera 22 may, at block 220 of the method, capture an image of the substrate 14, including the edges of the substrate. The image, hereinafter referred to as "the live image," may thus indicate the precise size and shape of the substrate 14.

At block 230, the controller 23 may use data representative of the live image captured in block 220, along with data representative of the test image captured in block 200, to determine how the substrate 14 may be oriented on the platen 12 in order for the dopant pattern projected by the mask 19 to be precisely centered on the substrate 14.

At block 240, the controller 23 may, based on the determination made in block 230, manipulate the drive mechanisms 30 of the registration devices 16, 1, 26 to horizontally reposition the substrate engagement surfaces 34 of the fingers 32 (as described above) in order for the dopant pattern projected by the mask 19 to, after the substrate 14 is moved into engagement with the substrate engagement surfaces 34 as described below, be precisely centered on the substrate 14.

At block 250, the substrate 14 may be placed on the platen 12 by the transport mechanism 21 (or by another device).

At block 260, the pushers 24 may move into engagement with an edge of the substrate 14 and may forcibly move the substrate 14 horizontally (i.e., along the x-axis and y-axis of the horizontal substrate plane) in order for the edge of the substrate 14 opposite the pushers 24 to be moved into engagement with the substrate engagement surfaces 34 of the fingers 32 of the registration devices 16, 18, 26. FIG. 2 does not show a pusher 24 positioned opposite registration device 26, but one may be provided. With the substrate 14 engaging the substrate engagement surfaces 34 thusly, and with the substrate engagement surfaces 34 having been repositioned as described in block 240, the substrate 14 may be oriented in order for the dopant pattern projected by the mask 19 to be precisely centered (e.g., to a precision of 40 um) on the substrate 14.

At block 270, the ion implanter 11 may project an ion beam through the mask 19 and onto the substrate 14. With the substrate 14 having been oriented as described in block 260, the dopant pattern projected onto the substrate 14 by the mask 19 can be precisely centered on the substrate 14.

At block 280, the substrate 14 can be removed from the platen 12 and passed along for further processing.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize its usefulness is not limited thereto and the present disclosure may be beneficially implemented in any number of environments for any number of purposes.

The invention claimed is:

1. An active substrate alignment system for an ion implanter comprising:
    a platen;
    a registration device adapted to selectively move a substrate engagement surface disposed adjacent the platen for limiting movement of a substrate disposed on the platen;
    a camera configured to capture an image of the substrate before the substrate is disposed on the platen; and
    a controller in communication with the camera and the registration device, the controller configured to command the registration device to move the substrate engagement surface based on the image to limit movement of the substrate in a predetermined manner.

2. The substrate alignment system of claim 1, further comprising a pusher disposed adjacent the platen and adapted to push the substrate into engagement with the substrate engagement surface.

3. The substrate alignment system of claim 2, wherein the pusher comprises a first pusher and a second pusher disposed on a first side of the platen in a parallel relationship with one another.

4. The substrate alignment system of claim 1, wherein the registration device comprises a first registration device and a second registration device disposed on a first side of the platen.

5. The substrate alignment system of claim 4, further comprising a third registration device disposed on a second side of the platen.

6. The active substrate alignment system of claim 1, wherein the camera is configured to capture an image of a first dopant pattern on the substrate before the substrate is disposed on the platen, and wherein the controller configured to command the registration device to move the substrate engagement surface based on the image so the first dopant pattern on the substrate will be aligned with a second dopant pattern projected onto the substrate after the substrate is positioned on the platen.

7. The active substrate alignment system of claim 1, wherein the controller is configured to command the registration device to move the engagement surface based on the image so a dopant pattern projected onto the substrate after the substrate is positioned on the platen will be centered on the substrate.

8. An active substrate alignment system for an ion implanter comprising:
    a platen;
    first and second registration devices adapted to selectively move respective first and second substrate engagement surfaces disposed on a first side of the platen for limiting movement of a substrate disposed on the platen;
    a camera configured to capture an image of the substrate before the substrate is disposed on the platen; and
    a controller in communication with the camera and the first and second registration devices, the controller configured to command the first and second registration devices to move the first and second substrate engagement surfaces based on the image to limit movement of the substrate in a predetermined manner; and a first pusher and a second pusher disposed on a second side of the platen in a parallel relationship with one another and adapted to push the substrate into engagement with the first and second substrate engagement surfaces.

* * * * *